United States Patent [19]

Deguchi et al.

[11] Patent Number: 4,879,255

[45] Date of Patent: Nov. 7, 1989

[54] METHOD FOR FABRICATING BIPOLAR-MOS DEVICES

[75] Inventors: Tatsuya Deguchi; Fumitake Mieno, both of Kawasaki, Japan

[73] Assignee: Fujitsu Limited, Kawasaki, Japan

[21] Appl. No.: 200,863

[22] Filed: Jun. 1, 1988

[30] Foreign Application Priority Data

Jun. 4, 1987 [JP] Japan .................. 62-140351

[51] Int. Cl.$^4$ .................. H01L 21/225; H01L 21/76
[52] U.S. Cl. .................. 431/59; 437/31; 437/34; 437/41; 437/46; 437/57; 437/89; 437/99
[58] Field of Search .................. 437/99, 41, 31, 228, 437/59, 46; 148/89, DIG. 9; 357/43, 4

[56] References Cited

U.S. PATENT DOCUMENTS

| | | | |
|---|---|---|---|
| 3,600,651 | 8/1971 | Duncan | 357/237 |
| 4,041,518 | 9/1977 | Shimizu et al. | 437/99 |
| 4,403,395 | 9/1983 | Curran | 437/41 |
| 4,445,268 | 5/1984 | Hinao | 437/59 |
| 4,475,279 | 10/1984 | Gahle | 437/59 |
| 4,499,657 | 2/1985 | Ooga et al. | 437/99 |
| 4,503,603 | 3/1985 | Blossfed | 437/59 |
| 4,694,562 | 9/1987 | Iwasaki et al. | 437/41 |
| 4,717,686 | 1/1988 | Jacobs et al. | 437/31 |
| 4,752,589 | 6/1988 | Schaber | 357/43 |

FOREIGN PATENT DOCUMENTS 0139266 5/1985 European Pat. Off. .......... 437/59
0139057 6/1986 Japan .......................... 437/59

Primary Examiner—Brian E. Hearn
Assistant Examiner—T. Thomas
Attorney, Agent, or Firm—Armstrong, Nikaido, Marmelstein, Kubovcik & Murray

[57] ABSTRACT

The present invention is a method for fabricating bipolar-MOS devices having n-MOSs, p-MOSs and bipolar transistors, each fabricated in a respective silicon single crystal layer grown in openings formed in a field oxide layer covering a silicon substrate. Over the field oxide layer, having openings where the active devices should be fabricated, is applied an epitaxial growth of silicon. By this operation, single crystal layers are formed in the openings, and a polysilicon layer is formed on the field oxide layer. The polysilicon layer is patterned to form the source and drain contact electrodes of the FETs and the base and collector contact electrodes of the bipolar transistors simultaneously. To the active areas, contact electrodes for the p-MOS, and base contact electrodes of the npn bipolar transistors are simultaneously implanted with p type impurities by ion implantation. The active areas, contact electrodes for the n-MOS, and the collector contact electrodes of the npn bipolar transistors are simultaneously implanted with n type impurities by ion implantation. For the pnp transistors, an inverse process of the above is applied. By such a method, the process for fabricating the bipolar-MOS device is simplified, and the operation of the device is improved.

2 Claims, 7 Drawing Sheets

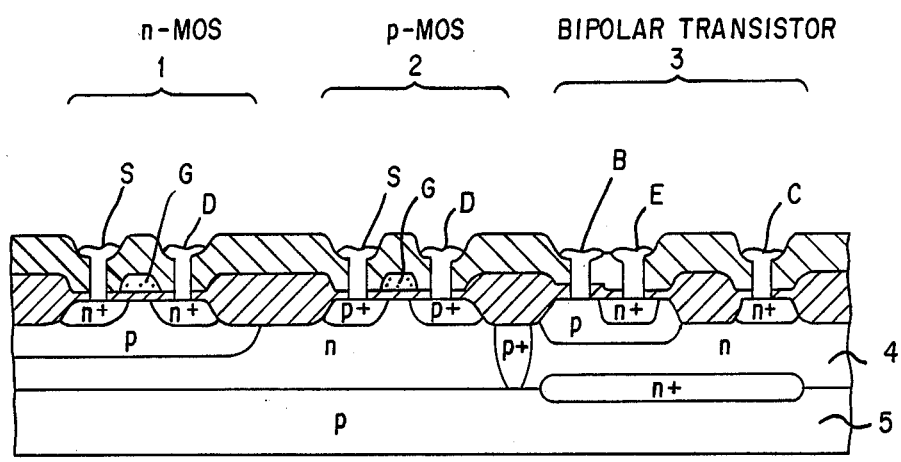
FIG. I PRIOR ART
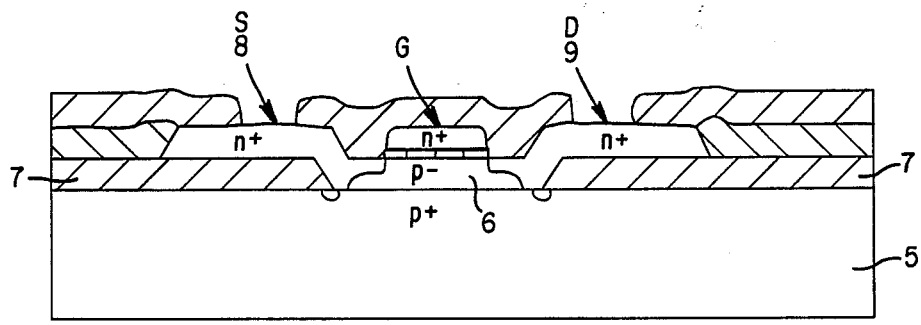
FIG. 2 PRIOR ART

FIG. 6a

FETs

| | n-MOS | | p-MOS | |
|---|---|---|---|---|
| | CONVENTIONAL | PRESENT INVENTION | CONVENTIONAL | PRESENT INVENTION |
| $V_{th}$ | 0.6 V | 0.6 V | −0.6 V | −0.6 V |
| $\beta$ | 1 mS/V | 1 mS/V | 0.5 mS/V | 0.5 mS/V |
| Leff | 1.0 μm | 1.0 μm | 1.0 μm | 1.0 μm |
| GATE WIDTH | 20 μm | 20 μm | 20 μm | 20 μm |
| $C_{SB}$ $C_{DB}$ | 75 fF | 25 fF | 75 fF | 25 fF |

BIPOLAR TRANSISTOR

| | CONVENTIONAL | PRESENT INVENTION |
|---|---|---|
| $f_t$ | 6 GHz | 6 GHz |
| EMITTER SIZE | 1.4 × 4 μm² | 1.4 × 4 μm² |
| $C_{CB}$ | 22 fF | 10 fF |

FIG. 6b

METHOD FOR FABRICATING BIPOLAR-MOS DEVICES

BACKGROUND OF THE INVENTION

The present invention relates to a method for fabricating bipolar-MOS (metal oxide semiconductor) devices. More specifically, it relates to a method to simultaneously fabricate the contact electrodes for each of the bipolar and MOS transistors in a bipolar-MOS device, thus simplifying the fabrication process. The present invention improves the size and the operation speed of the devices when compared to prior art devices fabricated with the same design.

A bipolar-MOS device is a semiconductor device which includes bipolar and MOS devices in a single semiconductor chip. It is often abbreviated as a Bi-MOS device in the art. An exemplar Bi-MOS device is shown in FIG. 1. The figure shows schematically a cross sectional view of a bipolar-MOS device having an n-channel MOS transistor (abbreviated as n-MOS hereinafter), a p channel MOS transistor 2 (abbreviated as p-MOS hereinafter) and an npn type bipolar transistor 3. In the prior art bipolar-MOS device, the FETs and the bipolar transistors are all fabricated in a substrate. More precisely, as can be seen in FIG. 1, they are fabricated in an expitaxial layer 4 formed on a substrate 5.

However, in the prior art configuration, parasitic capacitances are inevitably added to each of the pn junctions of the active regions such as the source S, drain D, emitter E, base B and so on. Therefore, no matter how small the devices are fabricated, it was impossible to increase the operation speed of these devices beyond a certain limiting value.

There are some proposals to increase the operation speed of FETs or bipolar transistors by decreasing the parasitic capacitances. For example, in a document of "A New Buried-Oxide Isolation for High-Speed High-Density MOS Integrated Circuits" by J. Sakurai, pp. 468-471, vol SC-13, No. 4, August 1978, IEEE is disclosed an FET which is fabricated in a selectively grown silicon single crystal over the substrate. The source, drain regions and their contact regions are formed over a thick silicon dioxide layer.

FIG. 2 illustrates a structure of such a FET. As can be seen in the figure, the FET is formed in a single crystal 6 formed over the substrate 5 in an opening of the field oxide layer 7. The contact regions 8 and 9, respectively for the source and the drain, are fabricated on the field oxide layer 7. By using this configuration, the stray capacitances of the pn junctions under these electrodes are reduced. Therefore, not only is the space factor of the device improved, but also the operation speed of the device is increased more than those of the prior art structures.

Recently, there is an increased demand for high speed and high density Bi-MOS devices. Therefore, an important problem arose on how to fabricate the above proposed devices combined in a single IC chip.

SUMMARY OF THE INVENTION

The object of the present invention is to provide a method for fabricating bipolar-MOS devices having reduced parasitic capacitances so as to increase the operation speed.

Another object of the present invention is to provide a method for further reducing the size of the elemental devices in the bipolar-MOS devices and to improve the spacing of the devices.

A further object of the present invention is to simplify the process for fabricating the bipolar-MOS devices.

These objects are attained by fabricating the elemental devices in single crystals grown in the openings of the field oxide layer, and forming the contact regions for the electrodes of these elemental devices on the field oxide layer.

By the fabrication method of the present invention, the contact electrodes for each of the MOS and bipolar transistors are fabricated at the same time during the same steps of production, so that the number of production steps are reduced and the process is simplified.

Other and further objects and advantages of the invention will become more apparent from the following description of preferred embodiment and accompanied drawings.

BRIEF DESCRIPTION OF THE DRAWINGS

FIG. 1 is a schematic diagram illustrating a cross sectional view of a prior art bipolar-MOS device.

FIG. 2 shows a structure of a FET fabricated in a single crystal formed in an opening of a field oxide layer.

FIG. 3 illustrates the steps for fabricating the bipolar-MOS device by the present invention, wherein:

Throughout the drawings the same or like reference numerals designate the same or similar parts.

FIG. 6 shows a table of a comparison of the difference between fabrication using the present invention and the prior art.

DESCRIPTION OF PREFERRED EMBODIMENTS

The process for fabricating the bipolar-MOS devices according to the present invention will be disclosed referring to a preferred embodiment shown in FIG. 3. The figure is a partial schematic cross section of a chip at a portion including a p-MOS, n-MOS and a bipolar transistor, illustrating how the cross section varies in major steps of the fabrication process. The description uses a p type substrate, but it will be obvious to those skilled in the art that the process may be easily applied to any other conductivity type substrate with minor modifications.

The technology and specific design value of the devices described in the following disclosure are all typical ones for a preferred embodiment. Therefore, the dimension, the impurity material, impurity concentration, or doping technology and fabrication technique of various parts are not restricted in this description. They can be modified properly according to the device to be fabricated using any technology in the art. Moreover, the process used in the present invention are familiar ones in the art, so, a detailed description will be omitted for the sake of simplicity, except for particular processes for this disclosure.

Figure 3A:
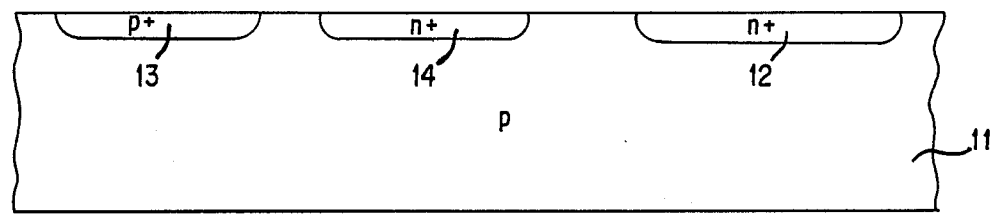
FIG. 3(a) illustrates a step in which various buried layers are fabricated.

First, as shown in FIG. 3(a), a p type silicon substrate 11 having a conductivity of 0.5 ohm cm, for example, is prepared and a p+ buried layer 13 for an n-MOS, an n+ buried layer 14 for a p-MOS and an n+ buried layer 12 for a bipolar transistor are fabricated at respective positions by ordinary selective ion implantation or diffusion processes using photoresist masks. As will become apparent in the following processes, over these buried layers are fabricated respectively the n-MOS, p-MOS and bipolar transistor.

Figure 3B:
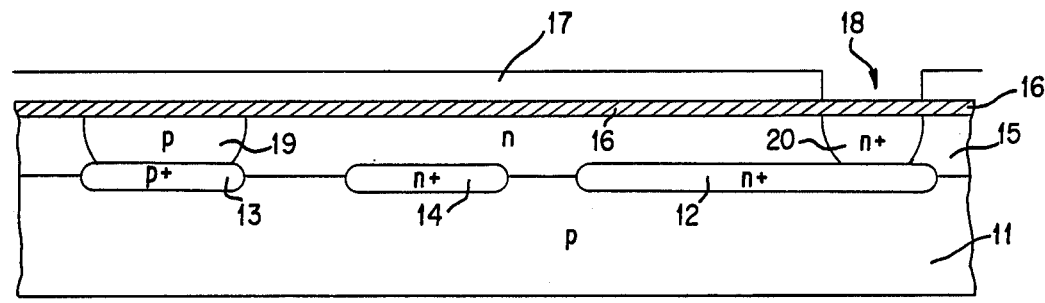
FIG. 3(b) shows a state after an epitaxial layer is grown, and well regions and contact region are formed in it.

Next as shown in FIG. 3(b), an n type silicon epitaxial layer 15 of 1 – 10 $\mu$ thick having a conductivity of 0.5 ohm cm is formed over the surface of the substrate 11. The words "substrate" will be used to designate hereinafter a bulk body including various parts fabricated in or over it. On the surface of the substrate is grown a thermal oxidized silicon dioxide (SiO$_2$) layer 16 of 500–1000 Å thick, and its surface is coated with a photoresist film 17. The photoresist film 17 is patterned by photolithography, first to open a window (not shown) over the p+ buried layer 13. A p type impurity of boron is doped into the epitaxial layer 15 through the window by ion implantation, using the photoresist film 17 as a mask. Boron ions of $2 \times 10^{12}$cm$^{-2}$ are implanted with an energy of 160 keV, for example. Then, the photoresist film 17 is removed, but it is formed again, and a second window 18 is opened over the buried layer 12 as shown in FIG. 3(b). Phosphorus ions of $2 \times 10^{15}$cm$^{-2}$ are implanted through the window 18 with an energy of 120 keV, for example. The substrate is then activated at a temperature of 1,200 °C for 30 minutes. Thus, a p type well region 19 and an n+ type collector contact region 20 are fabricated as can be seen in FIG. 3(b).

In the following description, the process or the process step concerning respective figures of FIG. 3 is called by the figure index. For example, the process described in the above paragraph is called as process (b), or step (b).

Figure 3C:
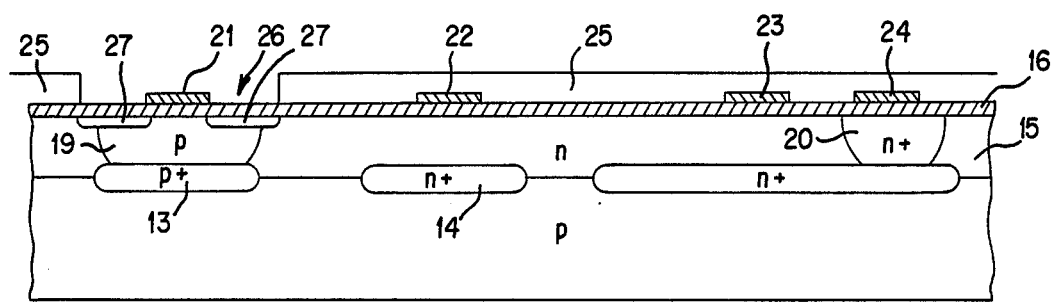
FIG. 3(c) illustrates a step to form channel cut regions.

After removing the photoresist film 17, as can be seen in FIG. 3(c), a silicon nitride (Si$_3$N$_4$) film of 1,000–2,000 Å thick is formed over the substrate, and patterned to cover the device regions. Namely, over the p well region 19 is formed the Si$_3$N$_4$ film 21 to cover the n-MOS region. Similarly, the Si$_3$N$_4$ patterns 22, 23 and 24 are formed at respective positions to cover the p-MOS region, the npn transistor region and its collector contact region 20 respectively. After that, a photoresist film 25 is coated over the surface of the substrate. It is patterned to provide an opening 26 at a portion to fabricate a p type channel cut region. Subsequently, using the photoresist film 25 and the Si$_3$N$_4$ pattern 21 as a mask, boron ions of $5 \times 10^{13}$cm$^{-2}$ dose are implanted into the opening 26 with an energy of 25 keV. This boron implanted region 27 becomes a channel cut region in the following step.

Figure 3D:
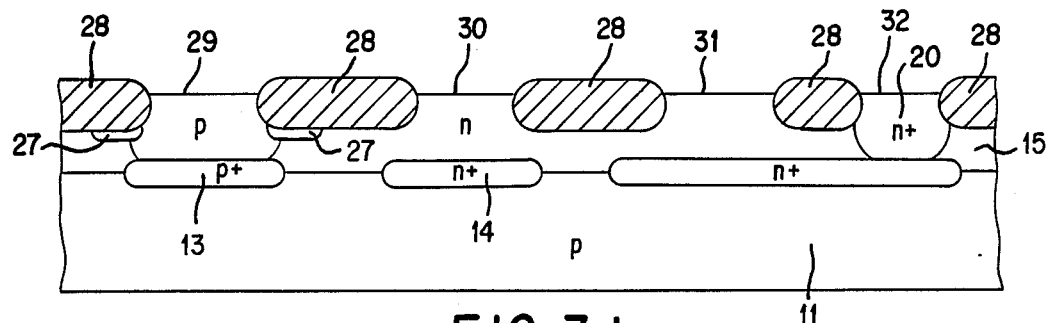
FIG. 3(d) shows a state when the field oxide layer has been formed.
Figure 3E:
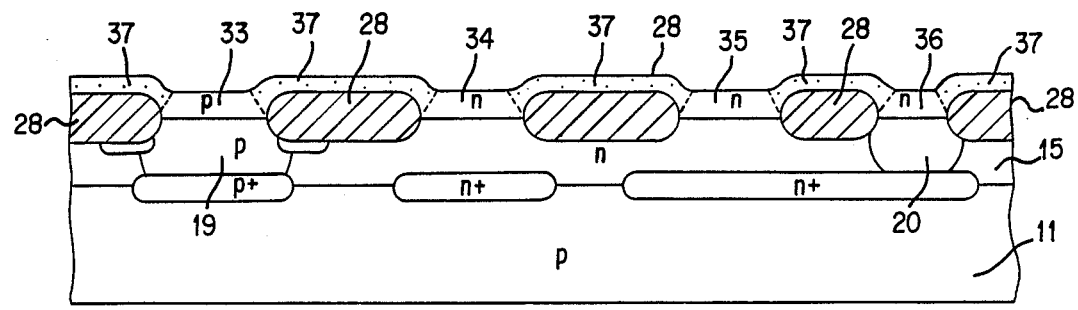
FIG. 3(e) illustrates a step to grow a polysilicon layer on the surface of the substrate, and to epitaxially grow the single crystal in the open area of the field oxide layer.

Next as shown in FIG. 3(d), the photoresist film 25 is removed, and the surface of the substrate is oxidized in a wet oxygen ambient of 900 °C for 2 hours. A thick silicon dioxide layer 28 of 6,000 – 8,000 Å is formed over the open spaces which are not covered by the silicon nitride films 21 – 24. This SiO$_2$ layer 28 is called a field oxide layer, which defines the regions where active devices are to be fabricated. By this oxidation process, the boron implanted region 27 in the process (c) is activated and it forms the channel cut region 27. The Si$_3$N$_4$ films 21, 22, 23 and 24 are removed, by boiling the substrate in phosphoric acid. Then the substrate becomes as shown in FIG. 3(d). In the openings 29, 30, 31 and 32 are fabricated respectively the n-MOS, p-MOS, npn transistor and its collector contact region 20, by the steps that follow.

In step (e), a phosphorus doped n type silicon single crystal layer having a conductivity of 0.5 ohm cm and a thickness of 1–10 $\mu$ thick is grown over the openings 29, 30, 31 and 32 by epitaxial growing technology. It is known in the art that when the operation of epitaxial growth is applied over a substrate which is covered by SiO$_2$, a polycrystalline silicon (polysilicon) grows over the SiO$_2$ layer, while over the exposed silicon surface a single crystal silicon is grown. Therefore, in the openings 29, 30, 31 and 32 are formed respectively a single crystal layers 33, 34, 35, 36 and on the field oxide layer 28 is grown a polysilicon layer 37. The boundaries between the polysilicon layers 37 and the single crystal silicon layers 33–36 are shown by dotted lines. The portions of the epitaxial silicon layer 33 over the well region 19 and adjacent polysilicon layer 37 thereof are inverted to p type by an ion implantation of boron by 60 keV and $2 \times 10^{12}$cm$^{-2}$ dose For this process, a photolithographic masking is necessary. The inversion of the conductivity type may be replaced by a selective diffusion process or a selective growth of p type epitaxial layer over the portion of the well region 19. These technologies are conventional ones in the art, so, further description is omitted.

Figure 3F:
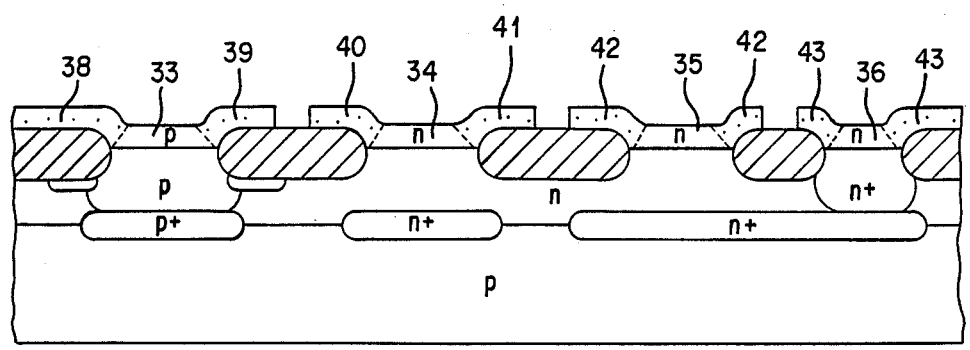
FIG. 3(f) shows a state when the polycrystalline layer has been patterned for respective devices.

Next, in step (f), as shown in FIG. 3(f), the polysilicon layer 37 is patterned to form a source contact region 38 and a drain contact region 39 for the n-MOS, a source contact region 40 and a drain contact region 41 for the p-MOS, and base contact regions 42 and collector contact regions 43 for the npn transistor. It is the first feature of the present invention, that these electrodes are formed simultaneously in a single process. This simplifies the present process compared to the prior art process.

Figure 3G:
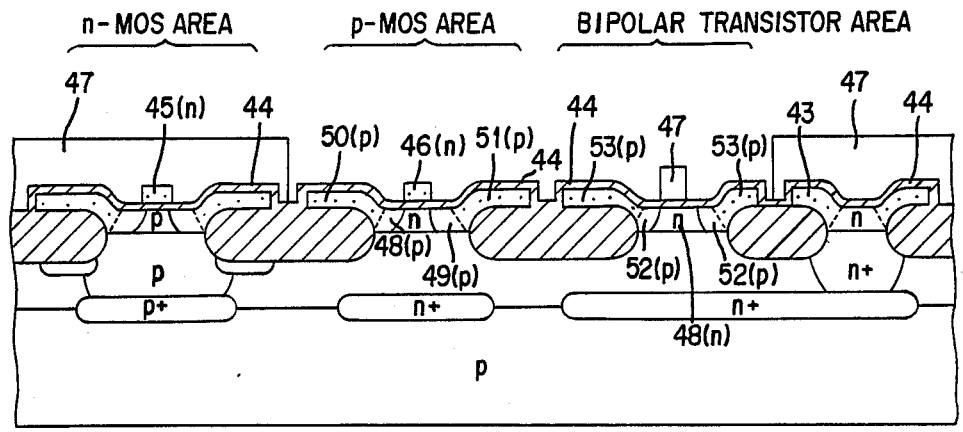
FIG. 3(g) shows a step to form gate electrodes, and to form the source and drain of the p-MOS transistors, and the base of the bipolar transistor at the same time.

Successively, as shown in FIG. 3(g), the surface of the substrate is thermally oxidized to form a thin SiO$_2$ layer 44 of 200 – 500 Å thick. By this oxidation, the gate oxide layers are formed over the single crystal layers 33 – 36, and the surface of the polysilicon layers 38 – 36 are also oxidized. Next, an n type polysilicon layer 4,000 Å thick is formed over the entire surface of the substrate, and it is patterned by photolithography to form the gates 45 and 46 for the n-MOS and p-MOS respectively, as shown in FIG. 3(g). A photoresist film 47 is coated over the substrate, and it is patterned to expose the p-MOS area and the npn bipolar transistor area. In this patterning, the base contact area 48 and the collector contact electrode 43 are left unexposed. The boron ions of $1.5 \times 10^{14} cm^{-2}$ dose are implanted by ion implantation with an energy of 60 keV.

By this process (g), a p type source region 48, a p type drain region 49 and their contact regions 50, 51 of the p MOS transistor, the extended base area 52 and its contact region 53 of the bipolar transistor are simultaneously fabricated in the same process. This is the second feature of the present invention to simplify the fabrication process.

Figure 3H:
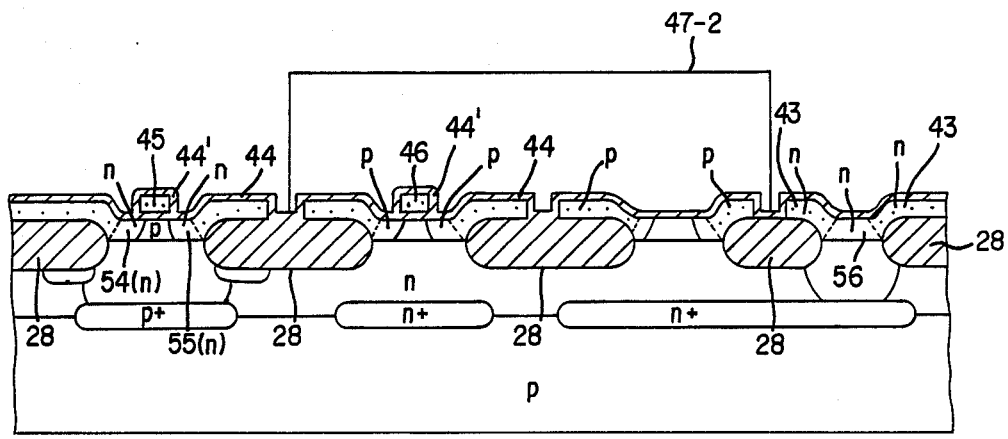
FIG. 3(h) shows a state when the active parts of the FETs are finished and the photo resist has been removed.

Next, as shown in FIG. 3(h), a source region 54, a drain region 55 of the n-MOS, the collector contact area 56 and collector contact region 43 of the bipolar transistor are fabricated by using a photoresist mask 47-2 and an ion implantation process which is similar to step (g). This is another feature of the present invention for simplifying the process. A photoresist film 47-2 is applied on the surface of the substrate, and it is patterned inversely to the one used in step (g). Namely, the n-MOS area, and the collector contact electrode area of the bipolar transistor are exposed outside the photoresist film 47-2. The exposed areas are implanted with phosphorus ions of $3 \times 10^{14} cm^{-2}$ dose with 80 keV. These implanted dopants (including the dopants implanted in the process (g)) are activated by thermal treatment of 900 °C for 30 min. In this process, the surface of the gates 45 and 46 are oxidized and coated with $SiO_2$ film 44'. These $SiO_2$ films are referred to as $SiO_2$ layer 44 hereinafter, because it is difficult to distinguish between gate oxide film 44 covering the gates and contact regions. Then the photoresist film 47-2 is removed. In the figure, the portion with dots indicates the polysilicon. The conductivity type at major parts are also indicated.

It will also be noticed that, in the foregoing processes, the mask alignment for photolithography is easy, because the masks are all used for fabricating large areas such as buried layers, well regions or device areas 21, 22, 23. Thus, the mask alignment is not very critical. In addition, each area which needs precise alignment, such as the active areas of the FETs and bipolar transistors, are all self aligned, and there is no need for precise mask alignment. This increases the yield of the production, and enables fabrication of smaller sized devices using the same design rule. Further, as can be seen, the contact regions for each of the active areas of the FETs and bipolar transistors are all arranged on the thick field oxide layer 28. Thus, the stray capacitance of the pn junctions are reduced. This is the third feature of the present invention.

Figure 3I:
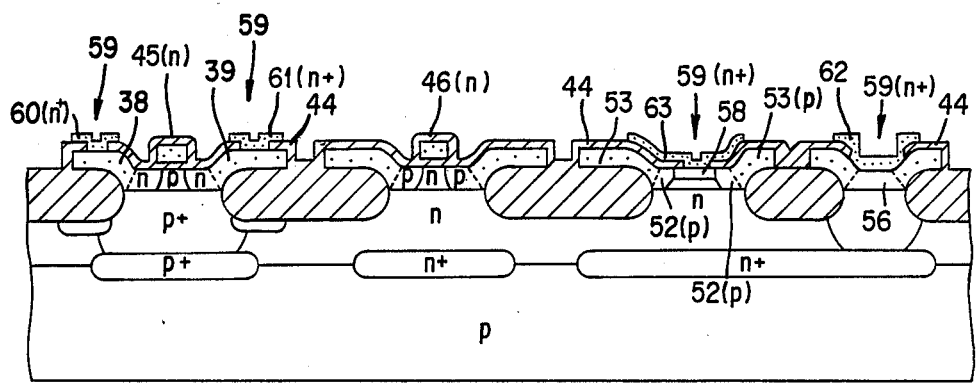
FIG. 3(i) illustrates s step to form the n-MOS transistor, the emitter of the bipolar transistor, and their contact electrodes at the same time.
Figure 3J:
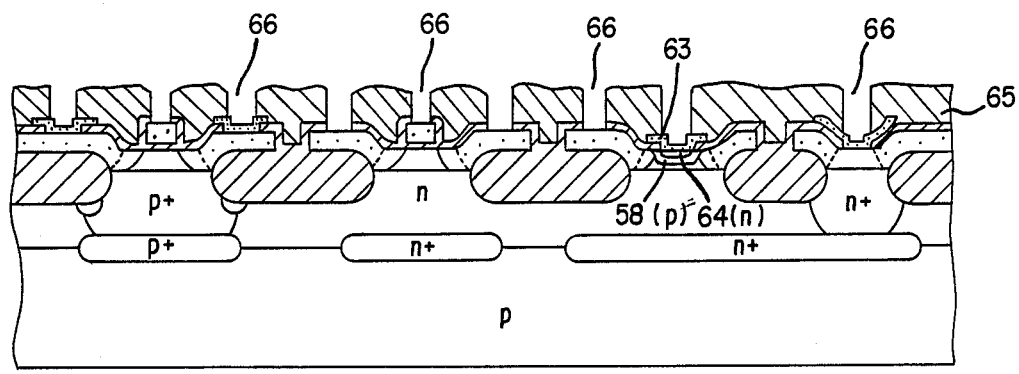
FIG. 3(j) illustrates a step when the surface protection layer and contact holes in it are formed.

Next, as shown in FIG. 3(i), a p type inner base 58 of the bipolar transistor is formed by ion implantation. This is done using a mask of photoresist film (not shown) which has an open window over the base area. The mask alignment for this window is not critical, because it may extend over the extended base area 52 or the base contact region 53. The ion implantation is done through the oxide layer 44 with an energy of 40 keV and $5 \times 10^{13} cm^{-2}$ dose of boron ions. After that, contact holes 59 are formed in the oxide layer 44 for the source contact region 38, drain contact region 39 of the n-MOS, the collector contact area 56 and emitter area 64 (that is shown in FIG. 3(j)) of the bipolar transistor. Succeedingly, a high doped n type polysilicon layer of 0.001 ohm cm and 0.1 $\mu$ thick is formed over the substrate. This polysilicon layer may be formed by chemical vapor deposition (CVD), and the doping may be done in the deposition process or by ion implantation after the deposition is finished. The polysilicon layer is then patterned as shown in FIG. 3(i), to form a source electrode 60, a drain electrode 61 of the n-MOS, a collector electrode 62 and an emitter electrode 63 of the bipolar transistor.

Next, as shown in FIG. 3(j), the substrate is thermally treated in nitrogen ambient at 950 °C for 30 minutes. By this thermal treatment, the dopant contained in the polysilicon of the emitter electrode 63 is driven into the single crystal beneath it and forms the emitter 64. At the same time, base dopant implanted in foregoing step (i) is activated. Both of the emitter and base dopants are diffused into the substrate. Therefore, the inner base 58 and the emitter region 64 become as shown in FIG. 3(j). Then the surface of the device is coated with a phosphor-silicate-glass (PSG) layer 65, for surface passivation. This PSG layer 65 is patterned as shown in the figure to provide contact holes 66 for each of the contact electrodes or contact regions.

Figure 3K:
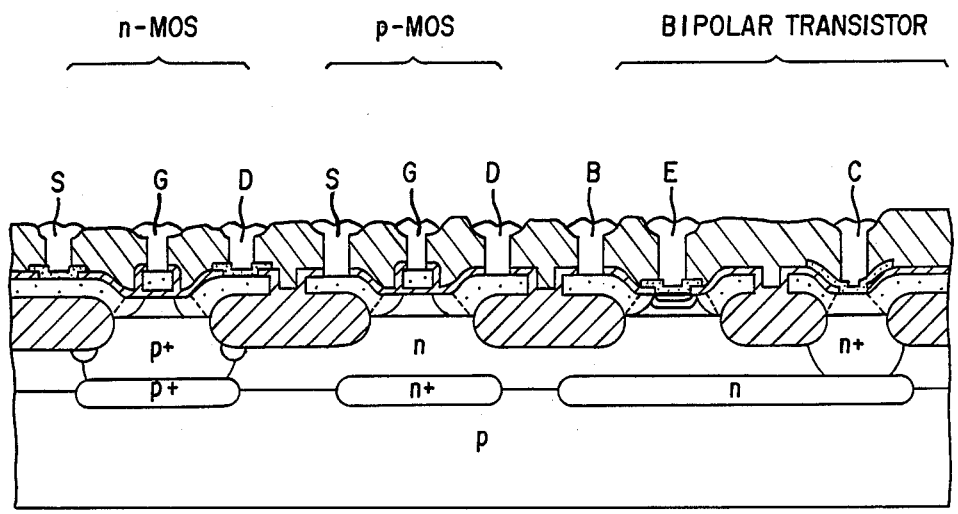
FIG. 3(k) shows a cross section of the device in the final state fabricated by the present invention.

Finally, as shown in FIG. 3(k), the surface of the device is coated by aluminum film, and it is patterned to form the terminals of source S, gate G, drain D, emitter E, base B and collector C.

In the above disclosure, the invention has been described with respect to a preferred embodiment including an n-MOS, a p-MOS and an npn bipolar transistor. It will be apparent for those skilled in the art that the process of the present invention can be easily extended to a device having pnp bipolar transistors, or further to a device which includes both the npn and pnp bipolar transistors. In such a case, the source, drain, their contact regions of the n-MOS are simultaneously fabricated together with the base contact region of the pnp transistors. Also, the collector contacts and the collector contact regions of the pnp transistors are fabricated simultaneously together with the source, drain and their contact electrodes of the p-MOS. These are inverse of those processes described before with respect to an npn transistors.

It will also be apparent that the process described in each step of the fabrication are not restricted to the ones explained in the above disclosure. They can be modified using any of the technology in the art suitable to the device to be fabricated. The materials, dopants or their dose are all variable within the scope of the present invention.

In order to show the effect of the process by the present invention over the prior art process, a simulation has been done comparing the operation of n-MOS, p-MOS and bipolar transistors fabricated by the present invention with those fabricated by the prior art process. For the comparison, the design rule for those devices has been chosen to be the same. The consequence are summarized in FIG. 6. In FIG. 6 the threshold voltage $V_{th}$, $\beta$, effective gate length $L_{eff}$, capacitance between source and ground base $C_{SB}$, capacitance between drain and ground base $C_{DB}$ for both of the n-MOS and p-MOS are compared between the conventional FET and the FET of the present invention. The bipolar transistors of the conventional one and that of the present invention are also compared by cutoff frequency $f_t$, emitter size and collector base capacitance $C_{CB}$. As can be seen in the table, a large decrease in the capacitance is shown by the present invention.

Figure 4:
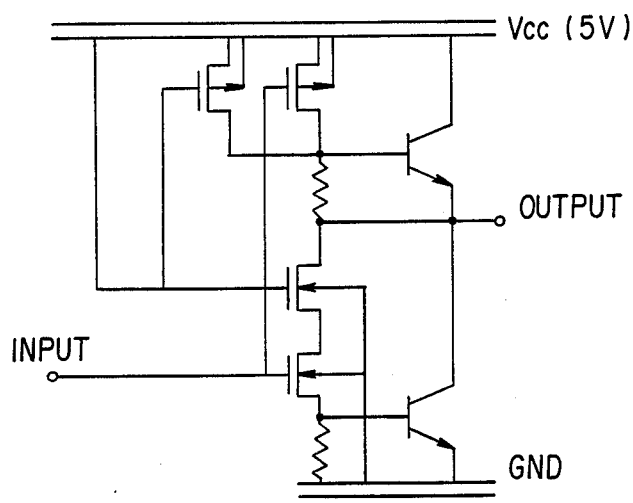
FIG. 4 is a circuit diagram used for simulating the operation of the device.
Figure 5:
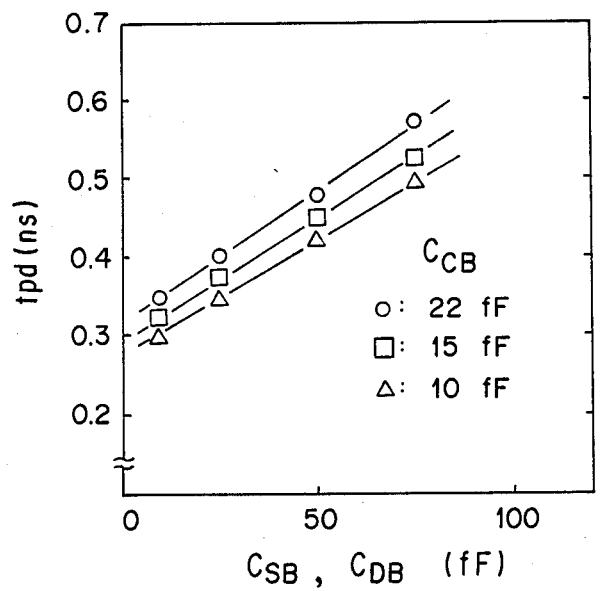
FIG. 5 is a graph showing the variation of the gate delay time versus the variation of source to ground capacitance $C_{SB}$ or drain to ground capacitance $C_{DB}$ for various bipolar transistors having different collector base capacitance $C_{CB}$.

The gate delay time $t_{pd}$ in the circuit of FIG. 4 is also simulated using the above data. The circuit is a two fan-in NAND gate circuit. Though only one input terminal is shown in the circuit, another input terminal is a Vcc line. FIG. 5 shows a simulated effect using various types of transistors. The abscissa is a capacitance $C_{SB}$ or $C_{DB}$ of the FETs used in the circuit of FIG. 4, and the ordinate is the gate delay time $t_{pd}$. The curves in FIG. 5 correspond to the bipolar transistors each having a different $C_{CB}$ used in the circuit of FIG. 4. If an ordinary bipolar transistor is used, that means, as can be seen in FIG. 6 $C_{CB}$ is 22 fF that corresponds to the line of circled data. If ordinary FETs are used, that is CSB is 75 fF, the $t_{pd}$ becomes 0.55 ns. But if FETs are replaced by the ones of the present invention, $C_{SB}$ and $C_{DB}$ decreases to 25 fF. So, the $t_{pd}$ decreases to 0.4 ns. If both the FETs and bipolar transistors are replaced by the ones of the present invention, $C_{CB}$ becomes 10 fF as can be seen in FIG. 6. Thus, the line with triangle data should be chosen since $C_{SB}$ and $C_{DB}$ are 25 fF and $t_{pd}$ is reduced to 0.35 ns. As can be seen in the above simulation, using both the FETs and bipolar transistors of the present invention, the gate delay time $t_{pd}$ is reduced to 0.35 ns from 0.55 ns of the prior art devices.

As can be seen in these simulations, the effect of the present invention is apparent. The parasitic capacitance is reduced, and the operation speed of the device is increased. The process of the present invention simplifies the process to fabricate the bipolar-MOS devices.

From the foregoing description of the preferred embodiment of the invention, it will be apparent that many modifications may be made therein. It should be understood that these embodiments are intended as one example of the invention only, and that the invention is not limited thereto. Therefore, it should be understood that the appended claims are intended to cover all modifications that fall within the true spirit and scope of the invention.

What is claimed is:

1. A method for fabricating a bipolar-MOS (metal oxide semiconductor) device including an n channel MOS-FET (field effect transistor), a p channel MOS-FET and an npn bipolar transistor, each fabricated in a silicon single crystal layer grown in openings formed in a field oxide layer covering a silicon substrate, said process comprising the steps of:
    (a) forming a field oxide layer over said silicon substrate, said field oxide layer having openings at the portions where said n channel MOS-FET, p channel MOS-FET and said npn bipolar transistor are fabricated;
    (b) growing epitaxial single crystal silicon layers over the surfaces of said substrate exposed in said openings, simultaneously growing a polysilicon layer over said field oxide layer;
    (c) patterning said polysilicon layer so as to separate into said single crystal silicon layers and adjacent polysilicon layers thereof, said separate adjacent polysilicon layers being source and drain contact regions of said n channel MOS-FET and p channel MOS-FET, and base and collector contact regions of said bipolar transistor;
    (d) forming gate electrodes on said single crystal silicon layers with a gate oxide film at the portions where said n channel and p channel MOS-FET are fabricated, and forming a base mask layer on said single crystal silicon layer adjacent to said base contact region;
    (e) selectively implanting p type impurities into said single crystal silicon layers and said adjacent polysilicon layers by ion implantation by using said gate electrode on said p channel MOS-FET portion and said base mask layer as masks so as to form a source region and a drain region in said single crystal silicon layer for said p channel MOS-FET and said source contact region and said drain contact region in said adjacent polysilicon layer for said p channel MOS-FET, and to form said base contact region in said adjacent polysilicon layer for said pnp bipolar transistor and an external base region in said single crystal silicon layer for said pnp bipolar transistor;
    (f) selectively implanting n type impurities into said single crystal silicon layers and said adjacent polysilicon layers by ion implantation by using said gate electrode on said n channel MOS-FET portion as a mask so as to form a source region and a drain region in said single crystal silicon layer for said n channel MOS-FET and said source contact region and said drain contact region in said adjacent polysilicon layer for said p channel MOS-FET, and to form a collector contact area in said single crystal silicon layer for said npn bipolar transistor and said collector contact region in said adjacent polysilicon layer for said npn bipolar transistor;
    (g) removing said base mask layer;
    (h) introducing p-type impurities into said single crystal silicon layer in which said external base region is formed so as to form an internal base region extending to said external base region; and
    (i) selectively introducing n type impurities into said internal base region to form an emitter region in said internal base region, wherein a vertical non bipolar transistor is formed in said single crystal silicon layer on the npn bipolar transistor portion.

2. A method for fabricating a bipolar-MOS (metal oxide semiconductor) device including an n channel MOS-FET (field effect transistor), a p channel MOS-FET and a pnp bipolar transistor each fabricated in a respective silicon single crystal layer grown in openings formed in a field oxide layer covering a silicon substrate, said process comprising the steps of:
    (a) forming a field oxide layer over said silicon substrate, said field oxide layer having openings at the portions where said n channel MOS-FET, p channel MOS-FET and said pnp bipolar transistor are fabricated;
    (b) growing epitaxial single crystal silicon layers over the surfaces of said substrate exposed in said openings, simultaneously growing a polysilicon layer over said field oxide layer;
    (c) patterning said polysilicon layer so as to separate into said single crystal silicon layers and adjacent polysilicon layers thereof, said separate adjacent polysilicon layers being source and drain contact regions of said n channel MOS-FET and p channel MOS-FET, and base and collector contact regions of said bipolar transistor;
    (d) forming gate electrodes on said single crystal silicon layers with a gate oxide film at the portions where said n channel and p channel MOS-FET are fabricated, and a base mask layer on said single crystal silicon layer adjacent to said base contact region;

(e) selectively implanting n type impurities into said single crystal silicon layers and said adjacent polysilicon layers by ion implantation by using said gate electrode on said n channel MOS-FET portion and said base mask layer as masks so as to form a source region and a drain region in said single crystal silicon layer for said n channel MOS-FET and said source contact region and said drain contact region in said adjacent polysilicon layer for said p channel MOS-FET, and to form said base contact region in said adjacent polysilicon layer for said pnp bipolar transistor and an external base region in said single crystal silicon layer for said pnp bipolar transistor;

(f) selectively implanting p type impurities into said single crystal silicon layers and said adjacent polysilicon layers by ion implantation by using said gate electrode on said p channel MOS-FET portion as a mask so as to form a source region and a drain region in said single crystal silicon layer for said n channel MOS-FET and said source contact region and said drain contact region in said adjacent polysilicon layer for said p channel MOS-FET, and to form a collector contact area in said single crystal silicon layer for said pnp bipolar transistor and said collector contact region in said adjacent polysilicon layer for said pnp bipolar transistor;

(g) removing said base mask layer;

(h) introducing n-type impurities into said single crystal silicon layer in which said external base region is formed so as to form an internal base region extending to said external base region; and (i) selectively introducing p type impurities into said internal base region to form an emitter region in said internal base region, wherein a vertical pnp bipolar transistor is formed in said single crystal silicon layer on the pnp bipolar transistor portion.

* * * * *